United States Patent [19]

Imai et al.

[11] Patent Number: 5,080,999
[45] Date of Patent: Jan. 14, 1992

[54] LIGHT-SENSITIVE DIAZO RESIN COMPOSITION CONTAINING A HIGHER FATTY ACID OR HIGHER FATTY ACID AMIDE

[75] Inventors: Masanori Imai; Mitsuru Koike; Noriaki Watanabe; Nobuyuki Kita; Tatsuji Higashi, all of Shizuoka, Japan

[73] Assignee: Fuji Photo Film Co., Ltd., Kanagawa, Japan

[21] Appl. No.: 707,190

[22] Filed: May 28, 1991

Related U.S. Application Data

[63] Continuation of Ser. No. 872,389, Jun. 10, 1986, abandoned.

[30] Foreign Application Priority Data

Jun. 10, 1985 [JP] Japan .................. 60-125460
Jul. 10, 1985 [JP] Japan .................. 60-151864

[51] Int. Cl.$^5$ .................. G03F 7/021; G03F 7/027; G03C 1/61
[52] U.S. Cl. .................. 430/175; 430/157; 430/176; 430/177; 430/179; 430/281; 430/287
[58] Field of Search .................. 430/175, 176, 192, 277, 430/281, 287, 177, 179, 157

[56] References Cited

U.S. PATENT DOCUMENTS

| | | | |
|---|---|---|---|
| 3,396,020 | 6/1968 | Borchers | 430/175 |
| 4,250,007 | 2/1981 | Yasuno et al. | 526/277 |
| 4,289,838 | 9/1981 | Rowe et al. | 430/175 |
| 4,292,392 | 9/1981 | Ikeda et al. | 430/271 |
| 4,294,905 | 10/1981 | Okishi et al. | 430/175 |
| 4,298,679 | 11/1981 | Shinozaki et al. | 430/281 |
| 4,411,983 | 10/1983 | Washizawa et al. | 430/325 |
| 4,511,645 | 4/1985 | Koike et al. | 430/287 |

FOREIGN PATENT DOCUMENTS

| | | | |
|---|---|---|---|
| 1153236 | 9/1983 | Canada | 430/175 |
| 1153236 | 9/1983 | Canada | 430/175 |
| 196230 | 12/1982 | Japan | 430/175 |
| 196230 | 12/1982 | Japan | 430/175 |
| 2044788 | 10/1980 | United Kingdom | 430/175 |
| 2044788 | 10/1980 | United Kingdom | 430/175 |

*Primary Examiner*—Charles L. Bowers, Jr.
*Assistant Examiner*—Christopher G. Young
*Attorney, Agent, or Firm*—Burns, Doane, Swecker & Mathis

[57] ABSTRACT

A light-sensitive composition which comprises, (a) an ethylenically unsaturated addition polymerizable compound, (b) an alkaline water-soluble or swellable, and film-forming polymer, (c) a photopolymerization initiator, (d) a negative working diazo resin, and (e) at least one compound selected from the group consisting of a higher fatty acid and a higher fatty acid amide which are solid at ordinary temperatures.

The light-sensitive composition is hardly influenced by oxygen and is suitable for a presensitized plate from which a printing plate is to be prepared.

9 Claims, No Drawings

5,080,999

LIGHT-SENSITIVE DIAZO RESIN COMPOSITION CONTAINING A HIGHER FATTY ACID OR HIGHER FATTY ACID AMIDE

This application is a continuation of application Ser. No. 06/872,389, filed June 10, 1986, abandoned.

BACKGROUND OF THE INVENTION (1) Field of the Invention

This invention relates to a light-sensitive composition useful for a presensitized plate from which a planographic printing plate is to be prepared, and particularly to a novel photopolymerizable composition which is wholly or almost wholly insusceptible to oxygen-induced inhibition of polymerization when a printing plate is prepared from a presensitised plate comprising the composition.

(2) Description of the Prior Art

There have been made many attempts to use photopolymerizable compositions as an image forming layer suitable for a presensitized plate. For instance, there have been known various compositions such as a basic composition comprising an organic solvent-soluble polymer, an ethylenically unsaturated addition polymerizable compound and a photopolymerization initiator as described in U.S. Pat. No. 3,458,311, a composition comprising an organic solvent-soluble polymer to which an unsaturated double bond is introduced to thereby have its hardening property improved as described in U.S. Pat. No. 3,796,578, a composition comprising a novel photopolymerization initiator as described in U.S. Pat. Nos. 3,549,367 and 3,751,259 and British Patent 1,388,492, etc. Some of these have been put into practice but it has been impossible, from the practical point of view, to use any of these compositions as a light-sensitive layer of a presensitized plate unless an oxygen barrier comprising a water-soluble resin is provided on the surface of the light-sensitive layer because the polymerization thereof is remarkably inhibited by oxygen during image-wise exposure. Attempts have been made to reduce the polymerization inhibition by oxygen by adding a negative working diazo resin to the photopolymerizable compositions, as described in Japanese Patent Applications (OPI) 206825/1984, 53836/1984, 178449/1984 and 196230/1982 (The term "OPI" as used herein refers to a "published unexamined Japanese Patent Application".) and U.S. Pat. No. 4,316,949. However, all of these attempts give only insufficient results.

SUMMARY OF THE INVENTION

Accordingly, an object of this invention is to provide a novel light-sensitive composition with no faults of the prior art, which can provide a printing plate having good printing durability.

The present inventors have found that a photopolymerizable composition containing a negative working diazo resin to which a higher fatty acid and/or its amide which are solid at ordinary temperatures has been added is wholly or almost wholly insusceptible to oxygen and a presensitised plate comprising the composition gives a printing plate with high printing durability even when no oxygen barrier is provided on the light-sensitive layer of the presensitised plate.

This invention is a light-sensitive composition which comprises (a) an ethylenically unsaturated addition polymerizable compound, (b) an alkaline water-soluble or swellable, and film-forming polymer, (c) a photopolymerization initiator, (d) a negative working diazo resin, and (e) at least one compound selected from the group consisting of a higher fatty acid and a higher fatty acid amide which are solid at ordinary temperatures.

DETAILED DESCRIPTION OF THE INVENTION

A photopolymerizable composition containing a negative working diazo resin is less susceptible to oxygen than a composition containing no diazo resin and the polymerization of the former composition is less inhibited by oxygen in air than that of the latter. It is believed that this is because the diazo resin evolves, upon exposure, an inert nitrogen gas which preserves the polymerization. It is, however, difficult, as described earlier, to completely eliminate the influence of oxygen on the polymerization by only the addition of the diazo resin. However, if a higher fatty acid and/or higher fatty acid amide, which are solid at ordinary temperatures, are added to the photopolymerizable composition to which the diazo resin has been added, the acid and/or amide, when the composition is coated and dried, come up to the surface of the light-sensitive layer to form a kind of oxygen barrier.

Although such an oxygen barrier is formed even when a so-called waxing compound such as a higher fatty acid is added to the composition containing no diazo resin, such barrier gives only insufficient results. In contrast, when a higher fatty acid and/or amide are added to the photopolymerizable composition containing the diazo resin, the light-sensitive layer comprising the composition is hardly influenced by oxygen in air, and therefore, it becomes possible to form a resin image with high printing durability. Further, the oxygen barrier deteriorates little with time, i.e., it has excellent long period storage stability.

Ethylenically unsaturated addition polymerizable compounds which can be used in this invention are monomers or oligomers having boiling points of 100° C. or more and at least one addition polymerizable unsaturated group per molecule and molecular weights of 10,000 or less. Such monomers or oliglmers include monofunctional acrylates or methacrylates such as polyethylene glycol mono(meth)acrylate, polypropylene glycol mono(meth)acrylate, phenoxyethyl (meth)acrylate; polyfunctional acrylates or methacrylates such as polyethylene glycol di(meth)acrylate, polypropylene di(meth)acrylate, trimethylolethane tri(meth)acrylate, neopentylglycol di(meth)acrylate, pentaerythritol tri(meth)acrylate, pentaerythritol tetra(meth)acrylate, dipentaerythritol hexa(meth)acrylate, hexanediol di(meth)acrylate, tri(acryloyloxyethyl)isocyanurate, (meth)acrylates of addition products of ethylene oxide or propylene oxide with polyalcohol such as glycerin, or trimethylol ethane; urethane acrylates as described in Japanese Patent Publications 41708/1973 and 6034/1975, and Japanese Patent Application (OPI) 37193/1976; polyester acrylates as described in Japanese Patent Application (OPI) 64183/1973, Japanese Patent Publications 43191/1974 and 30490/1977; and epoxy acrylates prepared from epoxy resin and (meth)acrylic acid. Further, photo-hardenable monomers or oligomers as described in NIPPON SETCHAKU KYOKAISHI (Journal of Nippon Adhesion Association) Vol. 20, No. 7, pages 300–308 can also be used in this invention.

As alkaline water-soluble or swellable, and film-forming polymers, there can be mentioned acidic vinyl copolymers having —COOH, —PO$_3$H$_2$, —SO$_3$H, —SO$_2$NH$_2$ or —SO$_2$NHCO— group and acid value of 50 to 200. Such copolymers include copolymers of benzyl (meth)acrylate/(meth)acrylic acid/optional other addition polymerizable vinyl monomer as described in Japanese Patent Publication 44615/1984; copolymers of methacrylic acid/methyl or ethyl methacrylate/alkyl methacrylate as described in Japanese Patent Publication 34327/1979; (meth)acrylic acid copolymers as described in Japanese Patent Publications 12577/1983 and 25957/1979 and Japanese Patent Application (OPI) 92723/1979; copolymers of allyl (meth)acrylate/(meth)acrylic acid/optional other addition polymerizable vinyl monomer as described in British Patent 2,129,822 and maleic anhydride copolymer half-esterified with pentaerythritol triacrylate as described in Japanese Patent Application (OPI) 71048/1984.

Among these, preferred are copolymers of benzyl (meth)acrylate/(meth)acrylic acid/optional other addition polymerizable vinyl monomer and copolymers of allyl (meth)acrylate/(meth)acrylic acid/optional other addition polymerizable vinyl monomer.

The weight ratio of these ethylenically unsaturated addition polymerizable compounds to these film-forming polymers is preferably from 0.5:9.5 to 5:5, particularly from 1:9 to 3:7.

Photopolymerization initiators which can be used in this invention include α-carbonyl compounds as described in U.S. Pat. Nos. 2,367,661 and 2,367,670, acyloin ethers as described in U.S. Pat. No. 2,448,828, aromatic acyloin compounds substituted by α-hydrocarbon as described in U.S. Pat. No. 2,722,512, polynuclear quinone compounds as described in U.S. Pat. Nos. 3,046,127 and 2,951,758, combination of triarylimidazole dimer with p-aminophenylketone as described in U.S. Pat. No. 3,549,367, trihalomethyl-s-triazine compounds as described in U.S. Pat. No. 4,239,850, acridine and phenazine compounds as described in U.S. Pat. No. 3,751,259, oxadiazol compounds as described in U.S. Pat. No. 4,212,970.

The amount of the photopolymerization initiator employed in the present invention is in a range of about 0.5 wt. % to about 15 wt. %, preferably 2 to 10 wt. % based on the total weight of the light-sensitive composition.

Higher fatty acids which are solid at ordinary temperatures and can be used in this invention include lauric acid, tridecylic acid, myristic acid, pentadecylic acid, palmitic acid, heptadecylic acid, stearic acid, nonadecanoic acid, arachic acid, behenic acid, lignoceric acid, cerotic acid, heptacosanoic acid, montanic acid, melissic acid, lacceric acid, etc. Of these, preferred are those having a melting point of 60° C. or higher.

Higher fatty acid amides which are solid at ordinary temperatures, and can be used in this invention, include lauric acid amide, tridecylic acid amide, myristic acid amide, pentadecylic acid amide, palmitic acid amide, heptadecylic acid amide, stearic acid amide, nonadecanoic acid amide, arachic acid amide, behenic acid amide, lignoceric acid amide, cerotic acid amide, heptacosanoic acid amide, montanic acid amide, melissic acid amide, lacceric acid amide, etc. Preferred are higher fatty acid amides having at least 17 carbon atoms, particularly those having a melting point of 100° C. or higher. These higher fatty acids or amides are added, alone or in combination, to the composition in an amount of 0.5 to 10 wt. %, preferably 1 to 5 wt. % based on the total weight of the composition.

Suitable negative working diazo resins which can be used in this invention are substantially insoluble in water but soluble in an organic solvent, and include reaction products of condensates of diazo monomer such as 4-diazo-diphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, p-diazo-dimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propoxy)-4-diazodiphenylamine, 3-(isopropoxy)-4-diazodiphenylamine, etc. and a condensing agent such as formaldehyde, acetaldehyde, propionic aldehyde, butyraldehyde, isobutyraldehyde, benzaldehyde etc. in a molar ratio of from 1:1 to 1:0.5, preferably from 1:0.8 to 1:0.6 in a conventional manner and anions. Such anions include those of tetrafluoroborate, hexafluorophosphate, triisopropylnaphthalenesulfonate, 5-nitro-ortho-toluenesulfonate, 5-sulfosalicylate, 2,5-dimethylbenzenesulfonate, 2,4,6-trimethylbenzenesulfonate, 2-nitrobenzensulfonate, 3-chlorobenzenesulfonate, 3-bromobenzenesulfonate, 2-fluorocapryl-naphthalenesulfonate, dodecylbenzenesulfonate, 1-naphthol-5-sulfonate, 2-methoxy-4-hydroxy-5-benzoyl-benzenesulfonate, para-toluenesulfonate, etc. Among these, preferred are those of hexafluorophosphate, and alkylarylsulfonate such as triisopropyl-naphthalenesulfonate and 2,5-dimethylbenzenesulfonate.

The amount of the diazo resin added to the composition of this invention is 1 to 30 wt. %, preferably 3 to 15 wt. % based on the total weight of the composition.

In addition to the above components, it is preferred to add a thermal polymerization inhibitor such as hydroquinone, p-methoxy-phenol, di-t-butyl-p-cresol, pyrogallol, t-butyl-catechol, benzoquinone, 4,4'-thiobis(3-methyl-6-t-butylphenol), 2,2'-methylene bis(4-methyl-6-t-butylphenol), 2-mercaptobenzimidazole, etc. If desired, there may be added dyes or pigments for coloring the light-sensitive layer and agents or compositions such as a pH indicator for obtaining a visible image immediately after image-wise exposure.

As a stabilizer for the diazo resin, there may be optionally added an acid such as phosphoric acid, phosphorous acid, tartaric acid, citric acid, malic acid, dipicolinic acid, polynuclear arylsulfonic acid, sulfosalicylic acid, a salt thereof, etc.

The light-sensitive composition is dissolved in a solvent such as 2-methoxyethanol, 2-methoxyethyl acetate, propyleneglycol monomethylether, 3-methoxypropanol, 3-methoxypropyl acetate, methyl ethyl ketone, ethylene dichloride, or a mixture thereof and coated on a support. Preferably, an ultrasonic dispersion mixer is used for accelerating the dissolution of the light-sensitive composition. The coating liquid is typically coated in an amount of about 0.1 to about 10g/m$^2$, preferably 0.5 to 5 g/m$^2$, expressed as solids content.

The support on which the light-sensitive composition of this invention is coated is a dimensionally stable plate including a support for a printing plate of the prior art, for example, paper, paper laminated with plastics (e.g., polyethylene, polypropylene, polystyrene), a plate of metal such as aluminum, aluminum alloy, zinc or copper, a film of plastic such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetate, and paper or plastic film on which the above-mentioned metal is laminated or deposited. Of these supports, aluminum plate is particularly preferred since it is very dimensionally stable and low in cost. Another preferred support is a polyethylene terephthalate film on which an aluminum sheet is laminated, as described in Japanese Patent Publication 18327/1973.

It is preferred that a support having a metal surface, particularly an aluminum surface, be subjected to surface treatment such as graining, dipping in an aqueous solution of sodium silicate, potassium fluorozirconate, phosphates, etc., or anodization. Further, there may be used an aluminum plate subjected to graining followed by dipping in an aqueous solution of sodium silicate and an aluminum plate first anodized and then dipped in an aqueous solution of alkali metal silicate as described in U.S. Pat. No. 3,181,461. Anodization can usually be carried out by applying an electric current to the aluminum plate in an electrolyte comprising an aqueous or nonaqueous solution of an inorganic acid such as phosphoric acid, chromic acid, sulfuric acid, boric acid, etc., an organic acid such as oxalic acid, sulfamic acid, etc. or mixtures thereof.

The silicate electro-deposition as described in U.S. Pat. No. 3,658,662 is also useful.

There is another useful surface treatment in which a support is subjected to electrolytic graining followed by the above anodization and sodium silicate treatment, as described in Japanese Patent Publication 27481/1971 and Japanese Patent Applications (OPI) 58602/1977 and 30503/1977. Still another useful method comprises brush graining, electrolytic graining, anodization and final sodium silicate treatment. After surface treatment, the support may be undercoated with a water soluble resin such as polyvinyl phosphonic acid, polymer or copolymer having sulfonate group in side chain or polyacrylic acid.

The objects of these surface treatments are to render the surface of the support hydrophilic, to avoid an undesired reaction between the support and the light-sensitive composition to be coated thereon, and to increase adhesion between the support and the light-sensitive layer.

On the layer of the light-sensitive composition provided on the support, there may be provided a protective layer of a polymer, such as polyvinyl alcohol, acidic celluloses, etc., which is excellent in oxygen barrier properties, in order to completely avoid the polymerization inhibition by oxygen in air. Details of coating methods for such protective layer are described in U.S. Pat. No. 3,458,311 and British Patent 1,441,339.

A presensitized plate comprising a support having coated thereon the light-sensitive composition of this invention is image-wise exposed to light of an ultraviolet ray rich light source such as a metal halide lamp or high-voltage mercury lamp, treated with a developing solution to remove unexposed areas in the light-sensitive layer, and finally coated with a desensitizing gum. Thus, a printing plate is obtained. As the developing solution, there is preferred an aqueous alkaline solution containing a small amount of an organic solvent such as benzyl alcohol, 2-phenoxyethanol, and 2-butoxyethanol, as described in U.S. Pat. Nos. 3,475,171 and 3,615,480. The developing solutions as described in Japanese Patent Application (OPI) 26601/1975 and Japanese Patent Publication 39464/1981 and U.S. Pat. No. 4,186,006 are also useful for developing the presensitized plate comprising the light-sensitive composition of this invention.

The following examples, wherein "%" indicates percent by weight, unless otherwise indicated, illustrate this invention.

EXAMPLE 1

A 0.30 mm thick aluminum plate was grained with a nylon brush and 400 mesh pumice-water suspension and washed well with water. The plate was immersed in 10% sodium hydroxide solution in water at 70° C. and etched for 60 seconds, washed with running water, neutralized with 20% nitric acid and washed with water. The plate was then electrolytically grained in 1% nitric acid using alternating sinusoidal current under conditions of 12.7 V of anodic voltage and 9.1 V of cathodic voltage such that the quantity of electricity at the anode time was 160 coulombs/dm$^2$. The surface roughness of the plate was 0.6 micron expressed by center-line average roughness (Ra). The plate was immersed in 30% $H_2SO_4$ at 55° C. for 2 minutes for desmutting and then anodized in 20% $H_2SO_4$ at a current density of 2 A/dm$^2$ for 2 minutes to produce an anodized coating of 2.7 g/m$^2$. The plate was immersed in 2.5% sodium silicate solution in water at 70° C. for 1 minute, washed with water and dried.

The following light-sensitive solution (1) was prepared.

| Light-sensitive solution (1) | |
|---|---|
| Trimethylolpropane triacrylate | 20 g |
| Copolymer of allyl methacrylate and methacrylic acid (molar ratio of 80/20, average molecular weight: about 50,000) | 50 g |
| 2,4-Trichloromethyl-(4'-methoxynaphthyl) s-triazine | 2 g |
| Hexafluorophosphate of a condensate between p-diazodiphenylamine and formaldehyde | 2 g |
| Behenic acid | 1 g |
| Ethyleneglycol monomethylether | 1500 g |
| Fluoro surfactant (F-177, produced by DAINIPPON INK & CHEMICALS, INC.) | 1.5 g |

The light-sensitive solution (1) was filtered and then coated on the plate using a whirler so as to result in a weight of 2.0 g/m$^2$ after drying. The plate was dried at 80° C. for 2 minutes. The resulting presensitized plate was designated as Sample A.

For comparison, a light-sensitive solution was prepared having the same composition as that of the light-sensitive solution (1) except that behenic acid was not used. This solution was coated and dried in the same manner as described above to produce Sample B.

For evaluating the degree of influence of oxygen on these plates, the plates were exposed to light through a PS step guide (a step tablet having 0.15 density difference produced by FUJI PHOTO FILM CO., LTD.) using a printer (produced by NuArc Co., USA and equipped with as its light source a 2 kW metalhalide lamp) with or without vacuumization of the printing frame of the printer. The plates were then developed with the following developing solution to remove unexposed areas.

| Developing solution: | |
|---|---|
| Sodium sulfite | 5 g |
| Benzyl alcohol | 30 g |
| Sodium carbonate | 5 g |
| Sodium isopropylnaphthalene sulfonate | 12 g |
| Purified water | 1000 g |

As seen from Table 1, the sensitivity of Sample A was high and not influenced by vacuum.

TABLE 1

| Influence of vacuum on sensitivity (the number of the step which became solid) | | |
|---|---|---|
| Sample | Vacuumized | Not vacuumized |
| A | 3.0 | 3.0 |
| B | 2.0 | 1.0 |

Each of these plates were installed in the printing machine (HEIDELBERG KOR-D) and printing was conducted. Sample A gave more than 100,000 copies but Sample B only 50,000 copies.

EXAMPLE 2

The procedure of EXAMPLE 1 was repeated except that the light-sensitive solution (1) was replaced by the following light-sensitive solution (2). The resulting presensitized plate was designated as Sample C.

| The light-sensitive solution (2) | |
|---|---|
| Dipentaerythritol hexaacrylate | 20 g |
| Copolymer of allyl methacrylate, benzyl methacrylate and methacrylic acid (molar ratio of 70/15/15) | 50 g |
| Photopolymerization initiator of the following formula | 2 g |

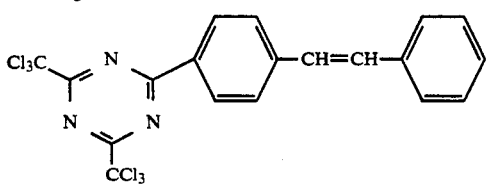

| Hexafluorophosphate of a condensate between p-diazodiphenylamine and formaldehyde | 3 g |
|---|---|
| Behenic acid | 1.5 g |
| Ethyleneglycol monomethylether | 800 g |
| Methyl alcohol | 300 g |
| Methyl ethyl ketone | 500 g |
| Fluoro surfactant (F-177, produced by DAINIPPON INK & CHEMICALS, INC.) | 1.5 g |

For comparison, a light-sensitive solution was prepared having the same composition as that of the light-sensitive solution (2) except that behenic acid was not used. This solution was coated and dried in the same manner as described above to produce Sample D.

As in EXAMPLE 1, the influence of vacuum was determined for Samples C and D. As shown in Table 2, Sample C was less influenced by vacuum and showed higher sensitivity than Sample D.

TABLE 2

| Influence of vacuum on sensitivity (the number of the step which became solid) | | |
|---|---|---|
| Sample | Vacuumized | Not vacuumized |
| C | 3.0 | 3.0 |
| D | 2.0 | 0.5 |

Each of Sample C image-wise exposed to light with or without vaccumizing and developed, and Sample D image-wise exposed to light with vacuumizing and developed was installed in the printing machine (HEIDELBERG KOR-D) and printing was conducted. Sample C, either with or without vacuumization, gave more than 100,000 copies but Sample D only 50,000 copies.

EXAMPLE 3

The procedure of EXAMPLE 1 was repeated except that the light-sensitive solution (1) was replaced by the following light-sensitive solution (3).

| The light-sensitive solution (3) | |
|---|---|
| Tri(acryloyloxyethyl)isocyanurate | 30 g |
| Copolymer of benzyl methacrylate and methacrylic acid (molar ratio of 75/25) | 50 g |
| 2-Trichloromethyl-5-(p-n-butoxystyrl)-1,3,4-oxadiazole | 2 g |
| Hexafluorophosphate of a condensate between p-diazodiphenylamine and formaldehyde | 3 g |
| Behenic acid | 1.5 g |
| Ethyleneglycol monomethylether | 1500 g |

The resulting plate was exposed to light through a negative transparency and developed to obtain a printing plate. The printing plate was installed in the printing machine (HEIDELBERG KOR-D) and printing was conducted. 100,000 copies were obtained.

EXAMPLE 4

The procedure of EXAMPLE 1 was repeated except that the light-sensitive composition liquid (1) was replaced by the following light-sensitive composition liquid (4).

| The light-sensitive solution (4) | |
|---|---|
| Trimethylolpropane triacrylate | 20 g |
| Copolymer of allyl methacrylate and methacrylic acid (molar ratio of 80/20, average molecular weight: about 150,000) | 50 g |
| 2,4-Trichloromethyl-(4'-methoxynaphthyl) s-triazine | 2 g |
| Hexafluorophosphate of a condensate between p-diazodiphenylamine and formaldehyde | 2 g |
| Behenic acid amide | 1 g |
| Propyleneglycol monomethylether | 1500 g |
| Fluoro surfactant (F-177, produced by DAINIPPON INK & CHEMICALS, INC.) | 1.5 g |

The light-sensitive solution (4) was filtered and then coated on the plate using a whirler so as to result in a weight of 2.0 g/m$^2$ after drying. The plate was dried at 80° C. for 2 minutes. The resulting presensitized plate was designated as Sample E.

For comparison, a light-sensitive solution was prepared having the same composition as that of the light-sensitive solution (4) except that behenic acid amide was not used. This solution was coated and dried in the same manner as described above to produce Sample F.

For evaluating the degree of influence of oxygen on these plates, the plates were exposed to light through a PS step guide (a step tablet having 0.15 density difference produced by FUJI PHOTO FILM CO., LTD.) using a printer (produced by NuArc Co., USA and equipped with as its light source a 2 kW metalhalide lamp) with or without vacuumization of the printing frame of the printer. The plates were then developed with the developing solution used in Example 1 to remove unexposed areas.

As seen from Table 3, the step tablet sensitivity of Sample E was high and not influenced by vacuum.

TABLE 3

| Influence of vacuum on sensitivity (the number of the step which became solid) | | |
| --- | --- | --- |
| Sample | Vacuumized | Not vacuumized |
| E | 3.0 | 3.0 |
| F | 2.0 | 1.0 |

Each of these plates was installed in the printing machine (HEIDELBERG KOR-D) and printing was conducted. Sample E gave more than 100,000 copies but Sample F only 50,000 copies.

Sample E was stored at 45° C. and 75% RH for 3 days, then similarly image-wise exposed to light and developed. The printing plate thus prepared was installed in the printing machine and printing was conducted. More than 100,000 copies were obtained.

EXAMPLE 5

The procedure of EXAMPLE 4 was repeated except that the light-sensitive solution (4) was replaced by the following light-sensitive solution (5), to obtain Sample G.

| The light-sensitive solution (5) | |
| --- | --- |
| Dipentaerythritol hexaacrylate | 20 g |
| Copolymer of allyl methacrylate, benzyl methacrylate and methacrylic acid (molar ratio of 70/15/15) | 50 g |
| Photopolymerization initiator of the following formula | 2 g |

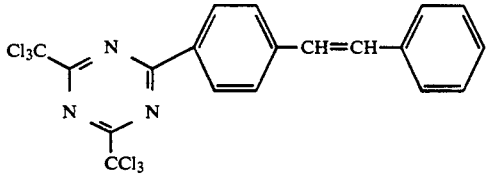

| Hexafluorophosphate of a condensate between p-diazodiphenylamine and formaldehyde | 3 g |
| --- | --- |
| Behenic acid amide | 1.5 g |
| Propyleneglycol monomethylether | 800 g |
| Methyl alcohol | 300 g |
| Methyl ethyl ketone | 500 g |
| Fluoro surfactant (F-177, produced by DAINIPPON INK & CHEMICALS, INC.) | 1.5 g |

For comparison, a light-sensitive solution was prepared having the same composition as that of the light-sensitive solution (5) except that behenic acid amide was not used. This solution was coated and dried in the same manner as described above to produce Sample H.

As in EXAMPLE 4, the influence of vacuum was determined for these Samples G and H. As shown in Table 4, Sample G was less influenced by vacuum and showed higher sensitivity than Sample H.

TABLE 4

| Influence of vacuum on sensitivity (the number of the step which became solid) | | |
| --- | --- | --- |
| Sample | Vacuumized | Not vacuumized |
| G | 3.0 | 3.0 |
| H | 2.0 | 0.5 |

Each of Sample G exposed to light with or without vaccumization and developed, and Sample H exposed to light with vacuumization and developed was installed in the printing machine (HEIDELBERG KOR-D) and printing was conducted. Sample G, either with or without vacuumization, gave more than 100,000 copies but Sample H only 50,000 copies.

EXAMPLE 6

The procedure of EXAMPLE 4 was repeated except that the light-sensitive solution (4) was replaced by the following light-sensitive solution (6).

| The light-sensitive solution (6) | |
| --- | --- |
| Tri(acryloyloxyethyl)isocyanurate | 30 g |
| Copolymer of benzyl methacrylate and methacrylic acid (molar ratio of 75/25) | 50 g |
| 2-Trichloromethyl-5-(p-n butoxystyrl)-1,3,4-oxadiazole | 2 g |
| Hexafluorophosphate of a condensate between p-diazodiphenylamine and formaldehyde | 3 g |
| Behenic acid amide | 1.0 g |
| Behenic acid | 1.0 g |
| Propyleneglycol monomethylether | 1500 g |

The resulting plate was exposed to light through a negative transparency and developed to obtain a printing plate. The printing plate was installed in the printing machine (HEIDELBERG KOR-D) and printing was conducted. 100,000 copies were obtained.

As seen from the above, the light-sensitive composition of this invention was hardly influenced by oxygen during image-wise exposure, so that it can give a resin image having excellent printing durability, that is, a printing plate prepared from a presensitized plate comprising the light-sensitive composition of this invention is excellent in printing durability.

What we claim is:
1. A light-sensitive composition which comprises in admixture,
    (a) an ethylenically unsaturated addition polymerizable compound;
    (b) an alkaline water-soluble or an alkaline water-swellable, and film forming polymer selected from the group consisting of a copolymer of benzyl (meth) acrylate and (meth) acrylic acid, and a copolymer of allyl (meth) acrylate and (meth) acrylic acid;
    (c) a photopolymerization initiator;
    (d) a negative working light-sensitive diazo resin; and
    (e) at least one compound selected from the group consisting of a higher fatty acid and a higher fatty acid amide, which are solid at ordinary temperature, wherein the components (a), (b) and (c) are contained in an amount sufficient to harden the composition upon exposure to light, the compo- nent (d) is present in an amount of 1 to 30% by weight based on the total weight of the composition, and the component (e) is contained in an amount of 0.5 to 10% by weight based on the total weight of the composition, said composition showing reduced inhibition of photopolymerization by oxygen.

2. The light-sensitive composition of claim 1, wherein the weight ratio of said ethylenically unsaturated addition polymerizable compound to said film-forming polymer is from 0.5:9.5 to 5:5.

3. The light-sensitive composition of claim 1, wherein said higher fatty acid is selected from the group consisting of lauric acid, tridecylic acid, myristic acid, pentadecylic acid, palmitic acid, heptadecylic acid, stearic acid, nonadecanoic acid, arachic acid, behenic acid, lignoceric acid, cerotic acid, heptacosanoic acid, montanic acid, melissic acid and lacceric acid.

4. The light-sensitive composition of claim 1, wherein said higher fatty acid amide is selected from the group consisting of lauric acid amide, tridecylic acid amide, myristic acid amide, pentadecylic acid amide, palmitic acid amide, heptadecylic acid amide, stearic acid amide, nonadecanoic acid amide, arachic acid amide, behenic acid amide, lignoceric acid amide, cerotic acid amide, heptacosanoic acid amide, montanic acid amide, melissic acid amide and lacceric acid amide.

5. A presensitized plate which comprises a support having coated thereon the light-sensitive composition as defined in claim 1.

6. The light-sensitive composition of claim 1 wherein said diazo resin is a reaction product of a condensate of a diazo monomer, a condensing agent and an anion.

7. The light-sensitive composition of claim 6, wherein said diazo monomer is selected from the group consisting of 4-diazo-diphenylamine, 1-diazo-4-N,N-dimethylamino-benzene, 1-diazo-4-N,N-diethylaminobenzene, 1-diazo-4-N-ethyl-N-hydroxyethylaminobenzene, 1-diazo-2,5-diethoxy-4-benzoylaminobenzene, 1-diazo-4-N-benzylaminobenzene, 1-diazo-4-morpholinobenzene, 1-diazo-4-N-methyl-N-hydroxyethylaminobenzene, 1-diazo-2,5-dimethoxy-4p-tolylmercaptobenzene, 1-diazo-2-ethoxy-4-N,N-dimethylaminobenzene, p-diazo-dimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propoxy)-4-diazodiphenylamine, and 3-(isopropoxy)-4-diazodiphenylamine.

8. The light-sensitive composition of claim 6, wherein said condensing agent is selected from the group consisting of formaldehyde, acetaldehyde, propionic aldehyde, butyraldehyde, isobutyraldehyde and benzaldehyde.

9. The light-sensitive composition of claim 6, wherein said anion is selected from the group consisting of tetrafluoroborate, hexafluorophosphate, triisopropylnaphthalenesulfonate, 5-nitro-orthotoluenesulfonate, 5-sulfosalicylate, 2,5-dimethylbenzenesulfonate, 2,4,6-trimethylbenzenesulfonate, 2-nitrobenzenesulfonate, 3-chlorobenzenesulfonate, 3-bromobenzenesulfonate, 2-fluorocapryl-naphthalenesulfonate, dodecylbenzenesulfonate, 1-naphthol-5-sulfonate, 2-methoxy-4-hydroxy-5-benzoyl-benzenesulfonate and paratoluenesulfonate.

* * * * *